United States Patent [19]
Bremner

[11] Patent Number: 5,900,771
[45] Date of Patent: *May 4, 1999

[54] CAPACITIVE MULTIPLIER FOR TIMING GENERATION

[76] Inventor: Duncan J. Bremner, Lochwinnoch, United Kingdom

[*] Notice: This patent issued on a continued prosecution application filed under 37 CFR 1.53(d), and is subject to the twenty year patent term provisions of 35 U.S.C. 154(a)(2).

[21] Appl. No.: 08/764,524

[22] Filed: Dec. 12, 1996

[51] Int. Cl.[6] .................................................. H03G 3/02
[52] U.S. Cl. ........................ 327/524; 327/103; 327/538; 327/530; 327/540; 327/552
[58] Field of Search ................................ 327/261, 266, 327/268, 524, 538, 575, 589, 390, 534, 103, 560, 563, 530

[56] References Cited

U.S. PATENT DOCUMENTS

| | | | |
|---|---|---|---|
| 4,013,904 | 3/1977 | Chick | 327/575 |
| 4,837,466 | 6/1989 | Kanauchi | 307/605 |
| 5,006,738 | 4/1991 | Usuki et al. | 307/594 |
| 5,081,380 | 1/1992 | Chen | 307/591 |
| 5,382,840 | 1/1995 | Massoner | 327/206 |
| 5,384,505 | 1/1995 | Takahashi | 327/262 |
| 5,650,746 | 7/1997 | Soltau | 327/524 |

OTHER PUBLICATIONS

Shah "A Fully Integrated Continuous–Time 1Hz Low–pass Filter With High Dynamic Range And Low Distortion", Technical University of Denmark.

Wiegerink, et al. "Offset Cancelling Circuit", IEEE Journal of Solid–State Circuits, vol. 24, No. 3, Jun. 1989; pp. 651–658.

*Primary Examiner*—Dinh Le

[57] ABSTRACT

A capacitive multiplier circuit for an integrated circuit includes a capacitor coupled between a first node and a second node. A current source is coupled to provide a controlling current to the second node. A first current path shunts the first node and a second current path shunts the second node. The first current path is a first transistor having its conductance path connected between the first node and the substrate and its control electrode connected to the first node. The second current path is a second transistor having its conductance path connected between the second node and the substrate and its control electrode connected to the first node. The current ratio between the two current paths will be determined by the relative areas of the respective conductance paths.

10 Claims, 2 Drawing Sheets

CAPACITIVE MULTIPLIER FOR TIMING GENERATION

FIELD OF THE INVENTION

The present invention relates to time delay circuitry for semiconductor integrated circuits, and more particularly, to a capacitive multiplier circuit which provides long delays for integrated circuits without taking up much silicon area.

BACKGROUND OF THE INVENTION

The ability to generate medium to long delays in semiconductor integrated circuits has been limited due either to the very small charging currents required, or to the large value of capacitors required which result in large, expensive areas of silicon. Additionally, if a method for producing small charging currents is implemented, the loading effects of measurement circuitry can give rise to errors. Therefore, it would be desirable to have a circuit which can provide significant time delays while avoiding these problems.

SUMMARY OF THE INVENTION

A capacitive multiplier circuit for a semiconductor integrated circuit includes a capacitor coupled between a first node and a second node and a current source coupled to the second node. A first current path shunts the first node and a second current path shunts the second node. The first current path conducts a first current which is a fractional portion of a second current in the second current path.

Preferably, the first current path includes a first bipolar transistor having its collector connected to the first node, its emitter connected to a reference voltage, and its base connected to the first node. The second current path includes a second bipolar transistor having its collector connected to the second node, its emitter connected to the voltage reference, and its base connected to the first node. The emitter of the second bipolar transistor has an area which is larger than an area of the emitter of the first bipolar transistor by a factor of N.

The bipolar transistors could of course be replaced with MOS transistors, wherein the current ratio is determined by the relative widths and lengths of the channels in respective transistors.

A better understanding of the features and advantages of the present invention will be obtained by reference to the following detailed description of the invention and accompanying drawings which set forth an illustrative embodiment in which the principles of the invention are utilized.

BRIEF DESCRIPTION OF THE DRAWINGS

FIG. 5b is the full application circuit implementing the circuit of FIG. 5a.

DETAILED DESCRIPTION OF THE INVENTION

The present invention is a capacitive multiplier circuit for an integrated circuit. The capacitive multiplier is useful for providing relatively long time constants using small capacitor values thereby avoiding the use of excessive silicon area in the semiconductor integrated circuit.

The capacitive multiplier circuit may be formed by taking a charging current which flows into a capacitor and dividing it into at least two current paths. Preferably, each current path includes a bipolar transistor, and the amount of current which flows through each current path is proportional to the relative size of the emitter in each current path. Thus, the time constant required for a particular application may be adjusted by sizing respective emitters appropriately. The invention may also be implemented with MOS transistors by choosing the size (i.e. width and length). of the source and/or drain regions appropriately.

Figure 1:
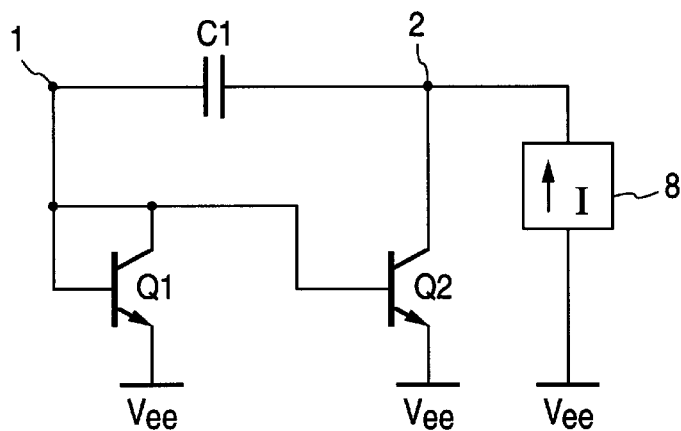
FIG. 1 is a schematic circuit diagram of a conceptual embodiment of a capacitive multiplier in accord with the-present invention.

A simplified conceptual implemtation of the circuit is shown in FIG. 1, wherein a capacitor C1 is coupled between a first node labeled 1 and a second node labeled 2. A source 8 is connected to the second node 2 for providing a control current to the circuit. A first current path shunts the first node 1 and comprises a first bipolar transistor Q1 having its base and collector commonly connected to node 1 and its emitter connected to a reference voltage $V_{ee}$, usually ground. A second current path shunts the second node 2 and comprises a second bipolar transistor Q2 having its base connected to node 1, its collector connected to node 2, and its emitter connected to reference voltage $V_{ee}$. The emitter of the second transistor Q2 is formed to have an area which is larger than that of the emitter of the first transistor Q1 by a factor of N. Therefore, the current flow in the two current paths formed by transistors Q1 and Q2 is in the ratio 1:N.

Figure 2:
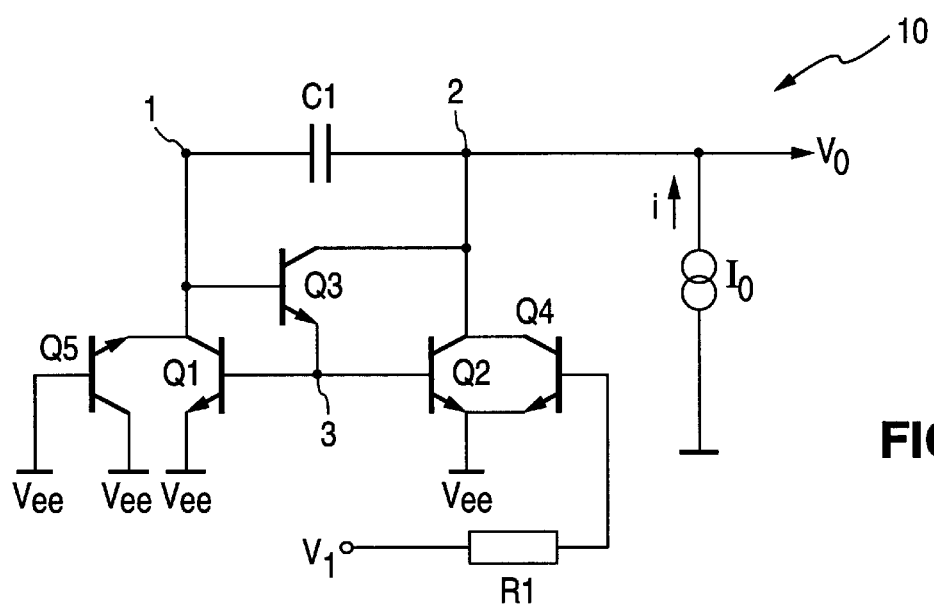
FIG. 2 is a schematic circuit diagram of the preferred embodiment of a capacitive multiplier in accord with the present invention.

Referring now to FIG. 2, the preferred embodiment for a capacitive multiplier circuit according to the present invention is illustrated. It should be recognized that circuit elements in all the Figures may be formed with conventional semiconductor fabrication techniques and a detailed description thereof is not necessary for the understanding of the present invention.

A capacitor C1 is connected between a pair of nodes which are labeled for reference as node 1 and node 2, respectively. A current source $I_0$ is coupled to provide a control current to node 2. A first bipolar transistor Q1 is formed having its collector coupled to node 1 and its emitter coupled to a reference voltage $V_{ee}$, which is typically the substrate and usually grounded. A second bipolar transistor Q2 is formed having its collector coupled to node 2 and its emitter coupled to the substrate. However, in accord with the present invention, the emitter of the second transistor Q2 is formed to have an area which is larger by a predetermined factor N than the emitter area of the first transistor Q1. Since the emitters of transistors Q1 and Q2 are formed such that their relative sizes have a ratio that is nominally 1:N, then the charging current is shared between transistors Q1 and Q2 in the following proportion (assuming the charging current is not significantly affected by current in transistor Q3):

$$\text{for transistor } Q1: \quad I_{Q1} = I_0 \times \frac{1}{1+N}$$

-continued for transistor Q2:  $I_{Q2} = I_0 \times \dfrac{N}{1+N}$

A third bipolar transistor Q3 has its base connected to node 1, its collector connected to node 2, and its emitter connected to a third node, node 3, which is connected both to the base of the first transistor Q1 and to the base of the second transistor Q2, such that transistor Q3 drives transistor Q2 in the well known Darlington configuration.

A fourth bipolar transistor Q4 has its collector connected to node 2, its emitter connected to the substrate, and its base connected to a voltage reference V1 through a resistor R1. Transistor Q4 is used to reset the timing circuit, and upon application of a voltage V1, which is sufficient based upon the value of the resistor R1, to cause transistor Q4 to saturate, for example, +3 V, the capacitor C1 will be fully discharged and ready for another timing cycle.

A fifth bipolar transistor Q5 has its emitter connected to node 1 and its base and collector connected to the substrate thereby effectively forming a diode. The diode-connected transistor Q5 serves the dual purpose of discharging the capacitor during reset, and to limit the potentially damaging negative-going voltage excursion at node 1.

The operation of the capacitive multiplier circuit will now be described. Initially, the effects of Q4, Q5, R1 and V1 are ignored and all the node voltages are zero. Then, upon application of the control current $I_0$, the common collectors of transistors Q2 and Q3 begin to rise since the devices are initially off. The charging current through capacitor C1 turns on transistor Q3, thereby turning on transistors Q1 and Q2.

The current in transistor Q3 can be ignored when N is much less than beta. Therefore, the charging current is dominated by the collector current of transistor Q1 and is less than the controlling current $I_0$ by a factor of N+1. However, the current ratio between transistor Q1 and transistor Q2 remains proportional to the ratio of the emitter areas. Hence, the charging current flowing through transistor Q1, and therefore into capacitor C1, is a fixed proportion of the controlling current $I_0$ and is independent of the transistor parameters, such as beta. This allows a relatively large current, which is easily generated, to be uses as the controlling current in the circuit while allowing small charging currents into the timing capacitor C1, hence allowing a smaller timing capacitor.

In one illustrative example, the circuit components have the following values: C1=10 pF, $I_0$=10 µA, and R1=10 kΩ.

Figure 3:
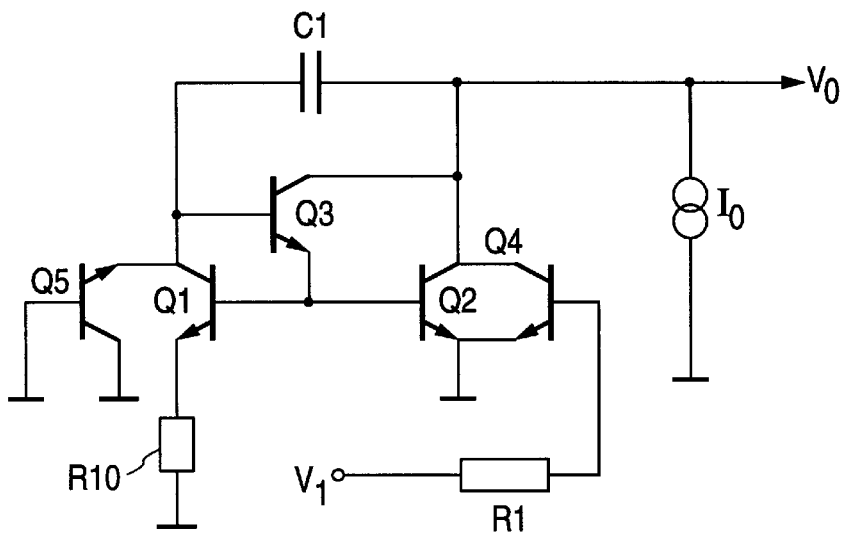
FIG. 3 is a schematic circuit diagram of an alternative embodiment of a capacitive multiplier in accord with the present invention.

An alternative embodiment is shown in FIG. 3, wherein the current ratio between transistors Q1 and Q2 can be established by using degeneration resistor R10 in the emitter connection of transistor Q1. For example, the emitters of transistors Q1 and Q2 could be nominally the same and resistor R10 have a value of 68.6 kΩ to provide a current ratio of 1:11, assuming $I_0$=10 µA.

Figure 4:
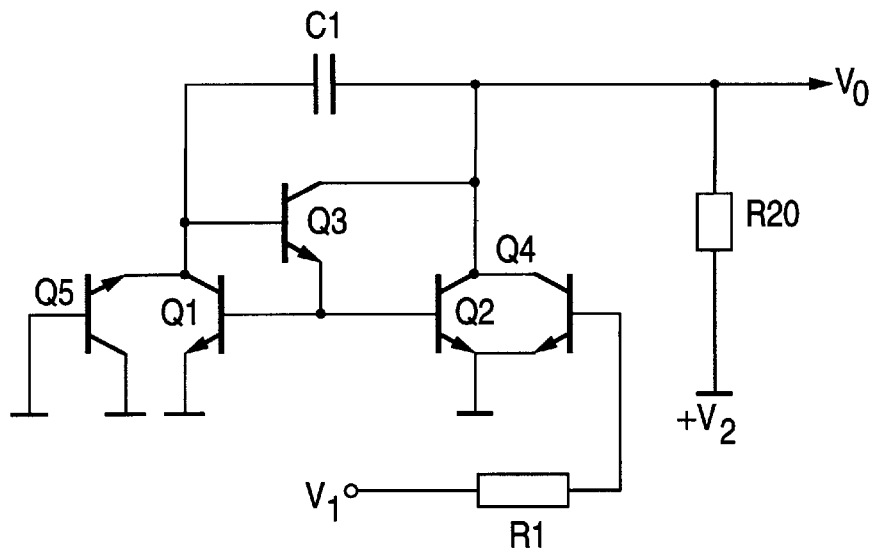
FIG. 4 is a schematic circuit diagram of another alternative embodiment of a capacitive multiplier in accord with the present invention.

In the embodiments of FIGS. 2 and 3, the controlling current is generated by a constant current source. However, the constant current source could be replaced by a resistor R20, as shown in FIG. 4, which generates an exponential voltage wave form similar to a conventional RC charging circuit, except that in this case, the time constant is multiplied by a factor of N+1. If the ratio of emitter Q1:Q2=1:N, the time constant is defined as t=(N+1)*R20*C1. It should be obvious to one with skill in this art that other methods could also be devised to provide a suitable contol current.

Figure 5A:
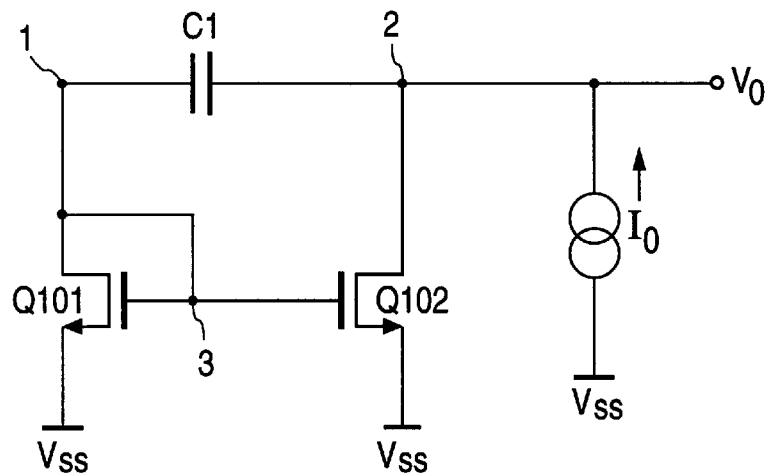
FIG. 5a is a schematic circuit diagram of yet another alternative embodiment of a capacitive multiplier in accord with the present invention.
Figure 5B:
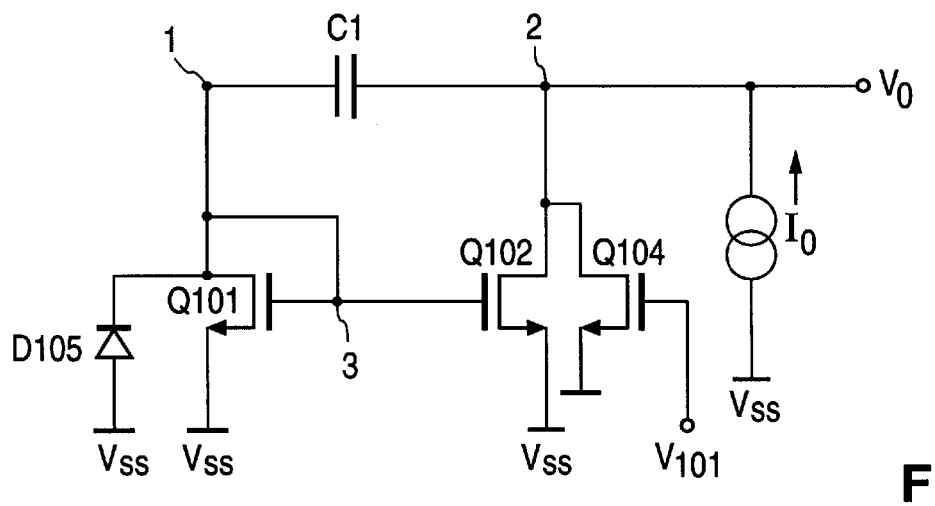

As previously mentioned, the inventive circuit could also be implemented with MOS technology, as illustrated in FIGS. 5a and 5b. A first CMOS transistor Q101 is formed having so that its source/drain conductance path, i.e. channel, is coupled between node 1 and a reference voltage $V_{ss}$, which is usually a grounded substrate. A second CMOS transistor Q102 is formed having its source/drain conductance path coupled between node 2 and the substrate. The gates or control electrodes of transistors 101 and 102 are mutually coupled together and also to the first node 1.

In accord with the present invention, the conductance path of the second transistor Q102 has an area which is larger by a predetermined factor N than the area of the conductance path of the first transistor Q101. Thus, if the channel width to length ratio of the conductance path of the first transistor Q101 is formed to be a/b, then the channel width to length ratio of the conductance path of the second transistor Q102 is formed to be N*a/b. That is, the ratio of currents between the first current path and the second current path is defined the relative width to length ratios for Q101 and Q102.

The full application circuit is shown in FIG. 5b, and includes CMOS transistor Q104, which corresponds to reset transistor Q4 in the bipolar embodiments. Upon application of a voltage V101 sufficient to saturate transistor Q104, for example +5 V, the capacitor C1 will fully discharge and be ready for another timing cycle. A diode D105 acts in the same manner described in the previous embodiments.

It should be understood that the invention is not intended to be limited by the specifics of the above-described embodiment, but rather defined by the accompanying claims.

I claim:

1. An integrated capacitive multiplier circuit comprising:
    a source for generating a current,
    a capacitor connected to the source,
    a current divider network connected across the capacitor, wherein the current divider network includes at least first and second current paths each shunting opposite terminals of the capacitor and having first and second transistors, respectively, formed therein, wherein the first transistor provides a first charging current flow through the first current path and the second transistor provides a second charging current flow through the second current path, and wherein the second charging current flow is proportional to the first charging current flow, and further wherein upon charging by the capacitor to a predetermined charge level the first and second transistor are turned off and the first and second charging current flows decrease to approximately zero, and
    a reset circuit, connected to said terminals of the capacitor, wherein the reset circuit receives a reset signal and in accordance therewith causes the capacitor to fully discharge.

2. An apparatus including a capacitance multiplier circuit, comprising:
    a first node for receiving an input current and in accordance therewith providing a charging current and a shunting current, wherein a sum of said charging and shunting currents equals said input current;
    a second node for receiving and conveying said charging current;
    a capacitive element, connected between said first and second nodes for receiving and conducting said charging current from said first node to said second node;
    a charging transistor circuit, connected to said second node, for receiving said charging current and in accordance therewith turning on, conducting said charging current and providing a bias voltage;

a shunting transistor circuit, connected to said first node and said charging transistor circuit, for receiving said bias voltage and in accordance therewith turning on and receiving and conducting said shunting current, wherein upon charging by said capacitive element to a predetermined charge level said charging transistor circuit is turned off and said charging current decrease to approximately zero; and a reset circuit, connected to said first and second nodes, for receiving a reset signal and in accordance therewith causing the capacitor to fully discharge.

3. The apparatus of claim 2 wherein said capacitive element comprises a capacitor.

4. The apparatus of claim 2, wherein said charging transistor circuit comprises a bipolar transistor.

5. The apparatus of claim 2, wherein said shunting transistor circuit comprises a bipolar transistor.

6. The apparatus of claim 2, wherein said charging transistor circuit comprises a metal oxide semiconductor field effect transistor.

7. The apparatus of claim 2, wherein said shunting transistor circuit comprises a metal oxide semiconductor field effect transistor.

8. The apparatus of claim 2, wherein:

said charging transistor circuit provides a first current conductance path for said charging current; and said shunting transistor circuit provides a second current conductance path for said shunting current, wherein said second current conductance path is larger than said first current conductance path.

9. The apparatus of claim 8, wherein:

said charging transistor circuit has a first emitter area; and said shunting transistor circuit has a second emitter area which is larger than said first emitter area.

10. The apparatus of claim 8, wherein:

said charging transistor circuit has a first channel width-to-length ratio; and said shunting transistor circuit has a second channel width-to-length ratio which is larger than said first channel width-to-length ratio.

* * * * *

UNITED STATES PATENT AND TRADEMARK OFFICE
CERTIFICATE OF CORRECTION

PATENT NO.: 5,900,771
DATED: May 4, 1999
INVENTOR(S): Duncan J. Bremner

It is certified that an error appears in the above-identified patent and that said Letters Patent is hereby corrected as shown below:

On the cover page, at [73], please insert --Assignee: NATIONAL SEMICONDUCTOR CORPORATION, Santa Clara, California--.

UNITED STATES PATENT AND TRADEMARK OFFICE
CERTIFICATE OF CORRECTION

PATENT NO.: 5,900,771
DATED: May 4, 1999
INVENTOR(S): Duncan J. Bremner

It is certified that errors appear in the above-identified patent and that said Letters Patent is hereby corrected as shown below:

In Col. 4, line 47, delete "transistor" and replace with --transistors--.

In Col. 5, line 7, delete "decrease" and replace with --decreases--.

In Col. 5, line 12, after "2" insert --,--.

Signed and Sealed this

Ninth Day of November, 1999

Q. TODD DICKINSON

*Attest:*

*Attesting Officer*   Acting Commissioner of Patents and Trademarks